United States Patent [19]

Haas et al.

[11] Patent Number: 4,728,371
[45] Date of Patent: Mar. 1, 1988

[54] METHOD FOR MANUFACTURING REGIONS HAVING ADJUSTABLE UNIFORM DOPING IN SILICON CRYSTAL WAFERS BY NEUTRON IRRADIATION

[75] Inventors: Ernst W. Haas; Joachim Martin, both of Erlangen; Heinz Mitlehner; Reinhold Kuhnert, both of Munich, all of Fed. Rep. of Germany

[73] Assignee: Siemens Aktiengesellschaft, Berlin and Munich, Fed. Rep. of Germany

[21] Appl. No.: 838,326

[22] Filed: Mar. 11, 1986

[30] Foreign Application Priority Data

Mar. 28, 1985 [DE] Fed. Rep. of Germany ....... 3511363

[51] Int. Cl.$^4$ .......................................... H01L 21/263
[52] U.S. Cl. ............................ 437/17; 148/DIG. 165; 357/91
[58] Field of Search ............... 148/1.5, 187; 29/576 B, 29/576 T; 357/91

[56] References Cited

U.S. PATENT DOCUMENTS

| | | | |
|---|---|---|---|
| 3,255,050 | 7/1966 | Klahr | 148/1.5 |
| 3,967,982 | 7/1976 | Arndt et al. | 148/1.5 |
| 4,119,441 | 10/1978 | Haas et al. | 148/1.5 |
| 4,275,405 | 6/1981 | Shannon | 148/DIG. 165 |
| 4,278,475 | 7/1981 | Bartko | 148/1.5 |
| 4,328,610 | 5/1982 | Thompson et al. | 29/571 |
| 4,469,527 | 9/1984 | Sugano et al. | 148/1.5 |
| 4,526,624 | 7/1985 | Tombrello et al. | 148/1.5 |

Primary Examiner—Roy Upendra
Attorney, Agent, or Firm—Hill, Van Santen, Steadman & Simpson

[57] ABSTRACT

A method for manufacturing regions having adjustable uniform doping in silicon crystal wafers by neutron irradiation according to the reaction $Si^{30}(n,\gamma)Si^{31}\beta \rightarrow P^{31}$ includes the steps of covering the silicon crystal wafer with neutron-absorbing materials of different thicknesses during the irradiation, and selecting materials having isotopes having a high absorption cross-section which yield stable isotopes in the nuclear reaction having small or short-lived activity. Suitable isotopes are $B^{10}$, $Cd^{113}$, $Sm^{149}$, $Gd^{155}$ and $Gd^{157}$. The regions are generated photolithographically. By such specific material selection, very small layer thicknesses can be used and microfine surface zones or areas can be doped with high geometrical precision and large penetration depth. The method is particularly suited for manufacturing power thyristors.

15 Claims, 4 Drawing Figures

METHOD FOR MANUFACTURING REGIONS HAVING ADJUSTABLE UNIFORM DOPING IN SILICON CRYSTAL WAFERS BY NEUTRON IRRADIATION

BACKGROUND OF THE INVENTION

1. Field of the Invention

The present invention relates to methods for generated selected surface structures on silicon crystal wafer by means of neutron irradiation, and in particular to a method for generating such regions with adjustable uniform doping suitable for use in manufacturing power thyristors.

2. Description of the Prior Art

Production of silicon crystals with uniform n-conductivity by irradiation with thermal neutrons is known in the art. The doping ensues according to the nuclear reaction $Si^{30}$ (n, $\gamma$) $Si^{31}\underrightarrow{\beta^-}P^{31}$. The natural isotope $Si^{30}$ present in the silicon wafer is converted into the unstable isotope $Si^{31}$ by absorbing a thermal neutron and emitting gamma radiation. The unstable $Si^{31}$ is converted into the stable phosphorous isotope $P^{31}$ upon emission of $\beta^-$ radiation with a half-life of 2.62 hours. In undertaking such irradiation, it is also known to cover selected regions on the silicon crystal wafer with neutron-absorbing materials.

A method for manufacturing pn-junctions in semiconductor components by doping using nuclear transformation is described in U.S. Pat. No. 3,255,050. A semiconductor crystal wafer of a selected conductivity is covered with absorber material except for those regions to be redoped, thus exposing the uncovered regions to neutron irradiation. After the radiation damage has cured, sharp pn-junctions are obtained in the crystal wafer. Boron and cadmium are used as absorber materials.

German Pat. No. 25 62 621 describes a method for manufacturing n-doped silicon single crystals having a dish-shaped profile of the specific resistance in the radial direction by means of irradiation with thermal neutons wherein the silicon single crystal is rotated during irradiation and is exposed to a more intense or less attenuated beam of thermal neutrons toward its center as opposed to its edge. The different irradiation is achieved, for example, by the use of a slit-shaped diaphragm of neutron absorbing material, for example, a cadmium sheet or boron glass which has a variable slit width. The absorber sheet is disposed in front of the silicon monocrystal. The silicon monocrystal is provided with a non-uniform doping over a large area in this manner, and is suitable for manufacturing large area, high-inhibiting power thyristors.

SUMMARY OF THE INVENTION

It is an object of the present invention to provide a selected uniform doping of microfine surface zones (less than 0.5 mm) with high geometrical precision and large penetration depth (in the range of 1 mm) in silicon crystal wafers (100 cm$^2$) suitable for the fabrication of power thyristors.

A further object of the present invention is to provide such a method wherein unnecessary radioactivity is avoided during and after neutron irradiation.

The above objects are inventively achieved in a method wherein isotopes of elements having a high absorption cross section ($\sigma > 3000$ barn) are employed as neutron absorbing materials. The nuclear reactions involving these elements yield stable isotopes or radionuclides having slight and/or short lived activity. The concentration of the doping for the selected regions is controlled by the layer thickness and/or the nature of the absorber materials. Photolithographic processes are used for generating the regions to be covered with the absorber material.

Within the framework of the present invention, the isotopes $B^{10}$, $Cd^{113}$, $Sm^{149}$, $Gd^{155}$ and $Gd^{157}$ are suitable for use as absorber materials.

In order to obtain the thinnest possible layers of neutron-absorbing material, only those materials which exhibit extremely high absorption properties can be utilized, these being, for example:

Boron $\sigma = 760$ barn
Cadmium $\sigma = 2\,450$ barn
Samarium $\sigma = 5\,800$ barn
Gadolinium $\sigma = 49\,000$ barn The above elements include a number of isotopes having very different neutron absorbing properties. Within the current state of the art for isotopic enrichment, the isotopes having the highest absorption properties are commercially available in substantially pure form, for example:

| | | | |
|---|---|---|---|
| $B^{10}$ | $\sigma = 3\,840$ barn | $Gd^{155}$ | $\sigma = 61\,000$ barn |
| $Cd^{113}$ | $\sigma = 19\,910$ barn | $Gd^{157}$ | $\sigma = 254\,000$ barn |
| $Sm^{149}$ | $\sigma = 41\,000$ barn | | |

When these enriched isotopes are used instead of the natural isotope mixtures, the necessary absorber thicknesses are reduced proportional to the absorption cross section. For example, the necessary thickness for $Gd^{157}$ in comparison to natural Gd is reduced by a factor of 5 and the thickness for $Sm^{149}$ is reduced by a factor of 7 over natural Sm. A further advantage of using such pure isotopes is the resulting yield of a stable isotope, rather than a radioactive isotope, upon neutron capture under selected conditions. All of the above isotopes, for example, result in such a yield. Even though slight contaminations by isotopes forming radioactive nuclides must be taken into account, the radioactivity which arises is nonetheless decisively reduced. $Gd^{157}$, for example, can be produced to a purity of 99.7%, so that the activity is lowered by a factor of approximately 300 in comparison to natural Gd.

DESCRIPTION OF THE PREFERRED EMBODIMENTS

Figure 1:
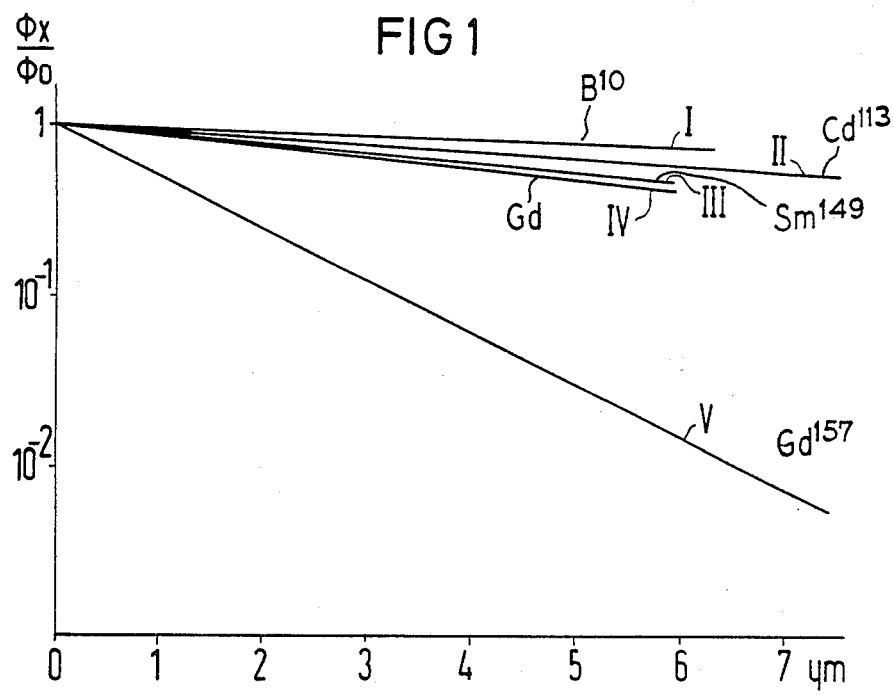
FIG. 1 is a graph showing the required layer thickness of neutron absorbers in accordance with the principles of the present invention for attenuating a given neutron flux density $\phi_x/\phi_0$.

FIG. 1 is a graph showing the necessary layer thickness for achieving a selected increase or reduction in neutron flux wherein the quotient of the neutron flux density $\phi_x/\phi_0$ is entered on the ordinate and the absorber thickness in μm is entered on the abscissa. $\phi_x$ is the thermoneutron flux density in neutrons per square centimeter-second at a location x in the silicon wafer, and $\phi_0$ is the thermoneutron flux in netrons per square centimeter-second at the absorber surface. The various lines on the graph in FIG. 1 represent the following elements:

Straightline I = $B^{10}$ isotope
Straightline II = $Cd^{113}$ isotope (96% enriched)
Straightline III = $Sm^{149}$ isotope (97% enriched)
Straightline IV = Gd (natural isotope composition)
Straightline V = $Gd^{157}$ isotope (91% enriched)

The application of the thin layers of absorber material can be undertaken by vapor deposition, such as a photoresist coating, or by ion beam deposition.

Figure 2:
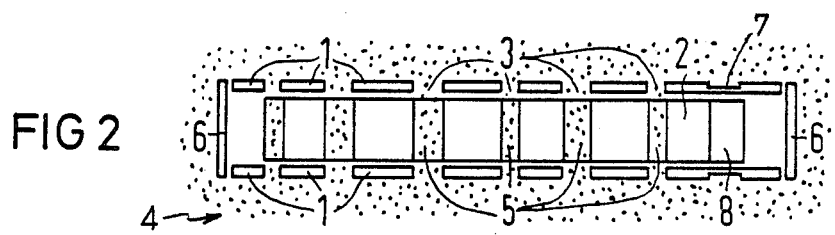
FIG. 2 is a section through a silicon crystal wafer to be provided with regions doped at different levels in accordance with the principles of the present invention.

An exemplary cross section embodiment of a silicon crystal wafer 2 already uniformly doped by neutron irradiation is shown in FIG. 2. Defined regions 5 and 8 are to be provided with a higher doping. The absorber material structures are referenced at 1, the openings 3 therein having been generated by masking and/or etching techniques which are known in semiconductor technology. The absorber layers 1 are applied to both wafer surfaces to achieve a geometrically uniform modification of the doping through the entire wafer thickness. The thermal neutrons provided for boosted doping are schematically shown as "neutron gas" 4. Edge coverings of absorber material are referenced at 6. An attenuated region 7 is shown in the absorber material which permits a higher or lower doping in the zone 8 in registry therewith in contrast to the regions 2 not covered with absorber materials, or the regions 5 doped higher in comparison thereto.

Figure 3:
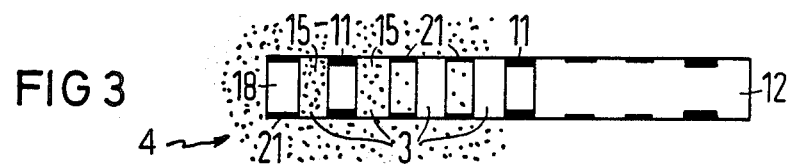
FIG. 3 is a section though a silicon crystal wafer to be doped in accordance with the principles of the present invention in a further embodiment.

In the embodiment shown in FIG. 3, regions 15 and 18 of a silicon crystal wafer 12 are provided with doping of different levels in one irradiation step. Absorber material structures 11 and 21 are provided on the silicon wafer 12 by ion beam deposition, the structures 11 and 21 consisting of, for example, $Gd^{157}$ isotope. The structures 11 and 21, differing in thickness, are generated by doses of different levels. For example, for generating a region-by-region 10% doping difference, either a $Gd^{157}$ film 1 (FIG. 2) having a thickness of 0.14 μm is necessary as the absorber mask, or, given the implantation of $Gd^{157}$ as the mask 11, the dose must be set at $5 \times 10^{17}/cm^2$. Again, the reference symbol 4 schematically indicates the "neutron gas" and the mask openings are referenced at 3. When the silicon crystal wafer 12 is pre-doped, it is possible to generate three differently doped regions 12, 15 and 18 in the wafer in one irradiation step.

Figure 4:
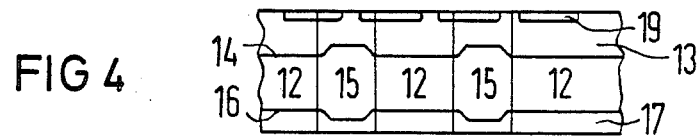
FIG. 4 is a section through a thyristor manufactured in accordance with the method of the present invention.

A thyristor having two differently doped regions 12 and 15 is schematically shown in FIG. 4. Independently of the absorber thickness and the mask structures, pn-junctions 14 and 16 are generated having a defined curved course can be generated in the regions 13 by subsequent aluminum diffusion. For example, channeling of the thyristor at a defined location and at a defined voltage can be achieved dependent on the differences in the phosphorous doping. The phosphorous doped region is referenced at 17, the pn-junction for the sweep voltage is referenced at 14, the pn-junction for the inhibit voltage is referenced at 16, and the cathode-emitters are referenced at 19.

Because enriched isotopes are expensive, the neutron influences for the doping concentrations generally required for thyristor material are low, i.e., only a slight consumption of isotope nuclei results, therefore it is preferable to re-prepare the cover layer (1, 6, 7, 11, 21) which contains enriched isotopes. This layer may be removed after the irradiation and re-used.

It has further proven preferable to separate the absorber layer from the surface of the silicon crystal by an intermediate layer. This intermediate layer perferably is photolithographically structurable and can be removed without deterioration of the basic silicon material. Such an intermediate layer may be, for example, a $SiO_2$ layer with selected material implanted therein, such as a boron-implanted $SiO_2$ layer which may be layers 11 and 21 in FIG. 3. The intermediate layer may also be achieved by deposition of the absorber, for example $Gd^{157}$ isotope onto an $SiO_2$ layer, such as layer 1 in FIG. 2. The intermediate layer may also be achieved by embedding the absorber, for example $Gd^{157}$, into photosensitive layers, in which case the absorber material layer 1 in FIG. 2 may consist of a photoresist structure. This latter embodiment promotes recovery of the absorber material to a high degree.

The advantages of the individual absorber layers shall be set forth below with reference to exemplary embodiments.

EXEMPLARY EMBODIMENT 1

All but 0.1% of the neutron flux is to be blocked on a region-by-region basis, because the pre-doped material is to receive a 10% higher doping only at designated locations.

The 10% doping increase at uncovered locations is achieved by a pre-calculatable neutron influence.

First, calculation of the required layer thickness of boron glass with a 10% boron content (natural isotope composition) for neutron absorption is under taken as follows:

$$\frac{\phi_x}{\phi_0} = \frac{10^{10}}{10^{13}} = e^{-\sigma \cdot N \cdot x}$$

$$\ln \frac{10^{10}}{10^{13}} = -\sigma \cdot N \cdot x$$

$$x = \frac{\ln \frac{10^{10}}{10^{13}}}{-\sigma \cdot N} = \frac{-6.9}{-7.55 \cdot 10^2 \cdot 10^{-24} \cdot 1.3 \cdot 10^{22}} = 0.96 \text{ cm}$$

wherein
$\phi_x$ = thermal neutron flux in neutrons/$cm^2$ . sec at location x in Si
$\phi_0$ = thermal neutron flux in neutrons/$cm^2$ . sec at the absorber surface
$\sigma$ = absorption coefficient for neutrons in $cm^2$
N = atoms of the absorber material/$cm^3$
x = layer thickness in cm.

Another alternative is to use boron glass with 10% boron content with a pure $B^{10}$ isotope in accordance with the invention, in which case boron glass having a thickness of approximately 0.2 cm is necessary for total neutron absorption.

Another possibility in accordance with the present invention is the use of 91% enriched $Gd^{157}$ isotope as a film in which case the layer thickness necessary is calculated as follows:

$$x = \frac{-6.9}{-2.3 \cdot 10^5 \cdot 10^{-24} \cdot 3 \cdot 10^{22}} = 0.001 \text{ cm} = 10 \text{ μm}$$

The required material thickness thus amounts to only 10 μm.

EXEMPLARY EMBODIMENT 2

If overall doping is undertaken with one irradiation, only the absorber thickness required for achieving a 10% doping difference must be generated.

If boron glass with 10% boron (natural isotope composition) is used, the thickness of the glass must be:

$$x = \frac{\ln\frac{1}{1.1}}{-\sigma \cdot N} = 100 \ \mu m.$$

If boron glass with a 10% isotope content is used, the glass must have a thickness of approximately 20 μm.

If a metal film of $Gd^{157}$ is utilized, the film must have a thickness of 0.14 μm. If the quantity of $Gd^{157}$ necessary to achieve this thickness is applied as a metal film by ion implantation, a does of approximately $5 \times 10^{17}/cm^2$ suffices to achieve a doped layer having $5 \times 10^{21}$ atoms/$cm^3$ is desired.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for manufacturing geometrically selected regions with adjustable uniform doping in a silicon crystal wafer by neutron irradiation according to the nuclear reaction $Si^{30}$ (n, γ) $Si^{31}\underline{\beta}-P^{31}$ comprising the steps of:

selecting a neutron absorbing material of isotopic composition having a high absorption cross-section which in said nuclear reaction yields stable isotopes or radio-nuclides having slight or short-lived activity;

applying said absorbing material in a selected pattern and thickness on at least one side of said wafer for a photolighographic process exposing said geometrically selected regions; and irradiating said wafer with said absorbing material thereon at a neutron flux density selected to achieve a desired doping concentration in said regions in accordance with the type and thickness of said absorbing material.

2. A method as claimed in claim 1, wherein said neutron absorbing material is selected from the group consisting of $B^{10}$, $Cd^{113}$, $Sm^{149}$, $Gd^{155}$ and $Gd_{157}$.

3. A method as claimed in claim 1, wherein the step of applying said absorber material is further defined by vapor-depositing said absorber material in combination with a photoresist layer.

4. A method as claimed in claim 1, wherein the step of applying said absorbing material is further defined by ion beam depositing said absorber material directly in said wafer.

5. A method as claimed in claim 1, wherein the step of applying said absorbing material is further defined by ion beam depositing said absorbing material in a $SiO_2$ layer.

6. A method as claimed in claim 1, comprising the additional step of:

applying an intermediate layer between said absorber material layer and said wafer, said intermediate layer being photo-structurable and removable from said wafer after irradiation without deterioration of the surface of said wafer.

7. A method as claimed in claim 1, wherein the step of applying said absorbing material is further defined by applying said absorbing material in a selected pattern and thickness in registry on opposite sides of said wafer.

8. A method as claimed in claim 1, wherein said absorber material is boron glass having a 10% $B^{10}$ isotope content.

9. A method as claimed in claim 1, wherein $Gd^{157}$ is selected as said neutron absorbing material, and wherein the step of applying said absorbing material is further defined by applying a metal film of $Gd^{157}$.

10. A method as claimed in claim 1, wherein $Gd^{157}$ is selected as said neutron absorbing material and wherein the step of applying said absorbing material is further defined by ion beam depositing of $Gd^{157}$ in said silicon wafer.

11. A method as claimed in claim 1, wherein the selected pattern and thickness of said absorbing material in the step of applying said absorbing material are selected for doping selected regions of said wafer to different levels and wherein said respective differently doped regions have correspondingly selected geometric shapes for manufacturing a power thyristor.

12. A method as claimed in claim 1, wherein said neutron absorbing material has an absorption cross-section greater than 3000 barn.

13. A method as claimed in claim 6, wherein said intermediate layer consist of $SiO_2$.

14. A method as claimed in claim 9, wherein, for generating a region-by-region 10% doping difference, said metal film of $Gd^{157}$ has a thickness of approximately 0.14 μm.

15. A method as claimed in claim 10, wherein the dose for said ion beam depositing of $Gd^{157}$ is approximately $5 \times 10^{17}/cm^2$.

* * * * *